US010615284B2

(12) United States Patent
Yang et al.

(10) Patent No.: US 10,615,284 B2
(45) Date of Patent: Apr. 7, 2020

(54) THIN FILM TRANSISTOR AND METHOD FOR FABRICATING THE SAME, DISPLAY SUBSTRATE, DISPLAY APPARATUS (71) Applicant: BOE TECHNOLOGY GROUP CO., LTD., Beijing (CN)

(72) Inventors: Wei Yang, Beijing (CN); Ce Ning, Beijing (CN); Hehe Hu, Beijing (CN); Ke Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/737,031

(22) PCT Filed: Jun. 16, 2017

(86) PCT No.: PCT/CN2017/088566
§ 371 (c)(1),
(2) Date: Dec. 15, 2017

(87) PCT Pub. No.: WO2018/113214
PCT Pub. Date: Jun. 28, 2018

(65) Prior Publication Data
US 2018/0374954 A1 Dec. 27, 2018

(30) Foreign Application Priority Data
Dec. 23, 2016 (CN) .......................... 2016 1 1204738

(51) Int. Cl.
H01L 29/786 (2006.01)
H01L 29/66 (2006.01)
(Continued)

(52) U.S. Cl.
CPC ...... H01L 29/7869 (2013.01); H01L 21/0273 (2013.01); H01L 21/465 (2013.01);
(Continued)

(58) Field of Classification Search
CPC .............. H01L 27/1225; H01L 21/465; H01L 29/66969; H01L 27/124; H01L 29/78696; H01L 27/127; H01L 29/7869
See application file for complete search history.

(56) References Cited

U.S. PATENT DOCUMENTS

2001/0049197 A1  12/2001  Yamazaki et al.
2010/0096634 A1   4/2010  Park et al.
(Continued)

FOREIGN PATENT DOCUMENTS

CN  102569414 A   7/2012
CN  103337462 A  10/2013
(Continued)

OTHER PUBLICATIONS

International search report dated Sep. 26, 2017 for corresponding application PCT/CN2017/088566 with English translation.
(Continued)

Primary Examiner — Thanh Y. Tran
(74) Attorney, Agent, or Firm — Nath, Goldberg & Meyer; Joshua B. Goldberg; Stephanie Majkut (57) ABSTRACT The present disclosure provides a thin film transistor, a method for fabricating the same, a display substrate, and a display apparatus, and belongs to the field of display technology. The method includes: forming a metal oxide semiconductor pattern comprising first and second metal oxide semiconductor layers, the second metal oxide semiconductor layer being above the first metal oxide semiconductor layer; depositing a source-drain metal layer on the metal oxide semiconductor pattern; etching the source-drain metal layer and the second metal oxide semiconductor layer to form source and drain electrodes and an active layer of the thin film transistor. The active layer is obtained after removing the second metal oxide semiconductor layer between the source and drain electrodes using a first etchant, and the first
(Continued)

etchant has a higher etching rate on the second metal oxide semiconductor layer than on the first metal oxide semiconductor layer.

11 Claims, 3 Drawing Sheets

(51) Int. Cl.
    *H01L 21/027*     (2006.01)
    *H01L 29/423*     (2006.01)
    *H01L 29/417*     (2006.01)
    *H01L 21/465*     (2006.01)
    *H01L 29/22*     (2006.01)
    *H01L 27/12*     (2006.01)
    *H01L 29/24*     (2006.01)
    *H01L 29/06*     (2006.01)

(52) U.S. Cl.
    CPC ...... *H01L 27/1225* (2013.01); *H01L 29/0684* (2013.01); *H01L 29/22* (2013.01); *H01L 29/24* (2013.01); *H01L 29/41733* (2013.01); *H01L 29/42384* (2013.01); *H01L 29/66742* (2013.01); *H01L 29/66969* (2013.01)

(56) References Cited

U.S. PATENT DOCUMENTS

2010/0099216 A1*   4/2010  Suzawa ............... H01L 27/1225
                                                                                               438/104
2014/0319520 A1*  10/2014  Sakata .................... H01L 29/16
                                                                                               257/43

FOREIGN PATENT DOCUMENTS

CN        205810822 U     12/2016
CN        106784014 A      5/2017

OTHER PUBLICATIONS

First Office Action dated Mar. 4, 2019 corresponding to Chinese application No. 201611204738.5.

* cited by examiner

THIN FILM TRANSISTOR AND METHOD FOR FABRICATING THE SAME, DISPLAY SUBSTRATE, DISPLAY APPARATUS

CROSS-REFERENCE TO RELATED APPLICATION

This is a National Phase Application filed under 35 U.S.C. 371 as a national stage of PCT/CN2017/088566, filed on Jun. 16, 2017, an application claiming the benefit of priority to China Patent Application No. 201611204738.5 filed on Dec. 23, 2016, the contents of which are incorporated herein in its entirety by reference.

TECHNICAL FIELD

The present disclosure relates to the field of display technology, and particularly relates to a thin film transistor, a method for fabricating the same, a display substrate and a display apparatus.

BACKGROUND

In the field of flat panel display technology, thin film transistor liquid crystal displays (TFT-LCD for short) have advantages such as small volume, low power consumption, low manufacturing costs, etc., and gradually occupy a dominant position in today's flat panel display market.

With the development of TFT-LCD technology, metal oxide thin film transistor (OTFT for short) technology becomes increasingly mature, has advantages such as high carrier mobility, low power consumption, ability to be applied to low-frequency drive, etc., and is also applicable to an organic light emitting diode display known as the next generation of display technology.

SUMMARY

The technical problem to be solved by the present disclosure is to provide a thin film transistor, a method for fabricating the same, a display substrate and a display apparatus, which can improve the stability of the metal oxide thin film transistor, and ensures display quality of the display apparatus.

To solve the above technical problem, embodiments of the present disclosure provide the following technical solutions.

In one aspect, there is provided a method for fabricating a thin film transistor, comprising: forming a metal oxide semiconductor pattern comprising a first metal oxide semiconductor layer and a second metal oxide semiconductor layer, which are stacked, the second metal oxide semiconductor layer being above the first metal oxide semiconductor layer; depositing a source-drain metal layer on the metal oxide semiconductor pattern; etching the source-drain metal layer and the second metal oxide semiconductor layer to form a source electrode, a drain electrode and an active layer of the thin film transistor, wherein the active layer is obtained after removing the second metal oxide semiconductor layer between the source electrode and the drain electrode using a first etchant, and a rate of etching the second metal oxide semiconductor layer by the first etchant is higher than a rate of etching the first metal oxide semiconductor layer by the first etchant.

Further, a ratio of the rate of etching the second metal oxide semiconductor layer by the first etchant to the rate of etching the first metal oxide semiconductor layer by the first etchant is no smaller than 10.

Further, the steps of depositing the source-drain metal layer on the metal oxide semiconductor pattern and etching the source-drain metal layer and the second metal oxide semiconductor layer to form the source electrode, the drain electrode and the active layer of the thin film transistor comprise: depositing the source-drain metal layer above the metal oxide semiconductor pattern; coating a photoresist on the source-drain metal layer, and exposing and developing the photoresist to form a photoresist retained area and a photoresist non-retained area, wherein the photoresist retained area corresponds to areas of the source electrode and the drain electrode of the thin film transistor, and the photoresist non-retained area corresponds to other area than the areas of the source electrode and the drain electrode of the thin film transistor; etching the source-drain metal layer and the second metal oxide semiconductor layer using the first etchant to remove the source-drain metal layer and the second metal oxide semiconductor layer in the photoresist non-retained area, thus forming the source electrode, the drain electrode and the active layer of the thin film transistor, wherein the active layer comprises the first metal oxide semiconductor layer, and the second metal oxide semiconductor layer between the first metal oxide semiconductor layer and the drain electrode and between the first metal oxide semiconductor layer and the source electrode.

The second metal oxide semiconductor layer is made of ZnO, ZnON or IZO, the first metal oxide semiconductor layer is made of IGZO, and the first etchant is $H_2O_2$ etching solution; or the second metal oxide semiconductor layer is made of ZnO, ZnON, IZO or IGZO, the first metal oxide semiconductor layer is made of ITZO, IGZTO or IGZXO, and the first etchant is Al etching solution.

Further, the steps of depositing the source-drain metal layer on the metal oxide semiconductor pattern and etching the source-drain metal layer and the second metal oxide semiconductor layer to form the source electrode, the drain electrode and the active layer of the thin film transistor comprise: depositing the source-drain metal layer above the metal oxide semiconductor pattern; coating a photoresist on the source-drain metal layer, and exposing the photoresist to form a photoresist retained area and a photoresist non-retained area, wherein the photoresist retained area corresponds to areas of the source electrode and the drain electrode of the thin film transistor, and the photoresist non-retained area corresponds to other area than the areas of the source electrode and the drain electrode of the thin film transistor; etching the source-drain metal layer using a second etchant to remove the source-drain metal layer in the photoresist non-retained area, thus forming the source electrode and the drain electrode of the thin film transistor; etching the second metal oxide semiconductor layer between the source electrode and the drain electrode using the first etchant to remove the second metal oxide semiconductor layer between the source electrode and the drain electrode, thus forming the active layer of the thin film transistor, wherein the active layer comprises the first metal oxide semiconductor layer, and the second metal oxide semiconductor layer between the first metal oxide semiconductor layer and the drain electrode and between the first metal oxide semiconductor layer and the source electrode.

Further, the second metal oxide semiconductor layer is made of ZnO, ZnON or IZO, the first metal oxide semiconductor layer is made of IGZO, and the first etchant is $H_2O_2$ etching solution; or the second metal oxide semiconductor layer is made of ZnO, ZnON, IZO or IGZO, the first metal oxide semiconductor layer is made of ITZO, IGZTO or IGZXO, and the first etchant is Al etching solution. When the source-drain metal layer comprises Cu, the second etchant is H$_2$O$_2$ etching solution; or when the source-drain metal layer comprises Mo or Al, AlNd, the second etchant is Mo etching solution.

Further, before the step of forming the metal oxide semiconductor pattern, the method further comprises: providing a base substrate; forming a gate electrode of the thin film transistor on the base substrate; and forming a gate insulating layer on the base substrate having the gate electrode formed thereon, wherein the metal oxide semiconductor pattern is formed on the gate insulating layer.

Further, after the step of forming the source electrode, the drain electrode and the active layer of the thin film transistor, the method further comprises: forming a gate insulating layer covering the source electrode, the drain electrode and the active layer; and forming a gate electrode of the thin film transistor on the gate insulating layer.

Embodiments of the present disclosure further provide a thin film transistor, fabricated by using the above-described method, wherein the active layer of the thin film transistor comprises the first metal oxide semiconductor layer, and the second metal oxide semiconductor layer between the first metal oxide semiconductor layer and the drain electrode and between the first metal oxide semiconductor layer and the source electrode. A rate at which the second metal oxide semiconductor layer is etched by a preset etchant is higher than a rate at which the first metal oxide semiconductor layer is etched by the preset etchant.

Embodiments of the present disclosure further provide a display substrate, comprising the above-described thin film transistor.

Embodiments of the present disclosure further provide a display apparatus comprising the above-described display substrate.

DETAILED DESCRIPTION

To make technical problems to be solved by, technical solutions and advantages of embodiments of the present disclosure clearer, detailed description will be given below in conjunction with the accompanying drawings and specific embodiments.

Unless otherwise defined, technical or scientific terms used herein shall have the same meaning as is commonly understood by a person of ordinary skill in the related art. Terms such as "first", "second", or the like used in the description and claims of the present disclosure do not denote any order, quantity, or importance, but are merely used to distinguish between different components. Similarly, terms such as "a", "an", or the like do not denote limitation on quantity, but denote the presence of at least one. Terms such as "connection", "couple", or the like are not limited to physical or mechanical connection, but may include electrical connection, whether direct or indirect. Terms such as "above", "below", "left", "right", or the like, are merely used to denote relative position relationship, which shall be changed accordingly as an absolute position of a described object is changed.

Inventors found that, in a process of fabricating a metal oxide thin film transistor in the related art, after an active layer of the thin film transistor is formed using a metal oxide, a source-drain metal layer is deposited on the active layer and etched to form a source electrode and a drain electrode. In order to avoid conductive ions of the source-drain metal layer from remaining in a channel region, etching time of the source-drain metal layer will be increased when etching the source-drain metal layer. However, when the etching time is increased, an etchant of the source-drain metal layer may damage back channel of the active layer, which affects the stability of the metal oxide thin film transistor.

In view of the problem that the stability of the metal oxide thin film transistor is affected because the etchant of the source-drain metal layer can easily damage the back channel of the active layer in the related art, embodiments of the present disclosure provide a thin film transistor, a method for fabricating the same, a display substrate and a display apparatus, which can improve the stability of the metal oxide thin film transistor and ensures display quality of the display apparatus.

Some embodiments of the present disclosure provide a method for fabricating a thin film transistor, which includes: forming a metal oxide semiconductor pattern including a first metal oxide semiconductor layer and a second metal oxide semiconductor layer which are stacked, the second metal oxide semiconductor layer being above the first metal oxide semiconductor layer; depositing a source-drain metal layer on the metal oxide semiconductor pattern; etching the source-drain metal layer and the second metal oxide semiconductor layer to form a source electrode, a drain electrode and an active layer of the thin film transistor, wherein the active layer is obtained after removing the second metal oxide semiconductor layer between the source electrode and the drain electrode using a first etchant, and a rate of etching the second metal oxide semiconductor layer by the first etchant is higher than a rate of etching the first metal oxide semiconductor layer by the first etchant.

In the present embodiment, the metal oxide semiconductor pattern includes the first metal oxide semiconductor layer and the second metal oxide semiconductor layer, which are stacked, the second metal oxide semiconductor layer being above the first metal oxide semiconductor layer, and the second metal oxide semiconductor layer between the source electrode and the drain electrode may be completely etched off when or after forming the source electrode and the drain electrode of the thin film transistor. In this way, residual conductive ions can be avoided from remaining on the first metal oxide semiconductor layer (main structure of the active layer) to affect characteristics of the thin film transistor. In the meanwhile, because the etching rate of the first etchant on the second metal oxide semiconductor layer is higher than the etching rate of the first etchant on the first metal oxide semiconductor layer, when etching the second metal oxide semiconductor layer using the first etchant, the second metal oxide semiconductor layer can be etched off easily, which can shorten etching time; the first metal oxide semiconductor layer can hardly be etched off, which can reduce damage to a back channel caused by the first etchant and thus improve the stability of the thin film transistor.

Optionally, a ratio of the etching rate of the first etchant on the second metal oxide semiconductor layer to the etching rate of the first etchant on the first metal oxide semiconductor layer is no smaller than 10. Thus, the first etchant has little effect on the first metal oxide semiconductor layer, and substantially no damage is caused to the first metal oxide semiconductor layer when etching the second metal oxide semiconductor layer using the first etchant.

In a specific embodiment, while the source electrode and the drain electrode are formed by etching the source-drain metal layer using the first etchant, the second metal oxide semiconductor layer may be etched using the first etchant to remove the second metal oxide semiconductor layer between the source electrode and the drain electrode, thus forming the active layer of the thin film transistor. In the present embodiment, the steps of depositing the source-drain metal layer on the metal oxide semiconductor pattern and etching the source-drain metal layer and the second metal oxide semiconductor layer to form the source electrode, the drain electrode and the active layer of the thin film transistor include: depositing the source-drain metal layer above the metal oxide semiconductor pattern; coating a photoresist on the source-drain metal layer, and forming a photoresist retained area and a photoresist non-retained area after exposing and developing the photoresist, wherein the photoresist retained area corresponds to areas of the source electrode and the drain electrode of the thin film transistor, and the photoresist non-retained area corresponds to other area than the areas of the source electrode and the drain electrode of the thin film transistor; etching the source-drain metal layer and the second metal oxide semiconductor layer using the first etchant to remove the source-drain metal layer and the second metal oxide semiconductor layer that are in the photoresist non-retained area, thus forming the source electrode, the drain electrode and the active layer of the thin film transistor, the active layer including the first metal oxide semiconductor layer, and the second metal oxide semiconductor layer between the first metal oxide semiconductor layer and the drain electrode and between the first metal oxide semiconductor layer and the source electrode.

In another specific embodiment, after the source electrode and the drain electrode of the thin film transistor are formed, the second metal oxide semiconductor layer may be etched using the first etchant to remove the second metal oxide semiconductor layer between the source electrode and the drain electrode, thus forming the active layer of the thin film transistor. In the present embodiment, the steps of depositing the source-drain metal layer on the metal oxide semiconductor pattern and etching the source-drain metal layer and the second metal oxide semiconductor layer to form the source electrode, the drain electrode and the active layer of the thin film transistor include: depositing the source-drain metal layer above the metal oxide semiconductor pattern; coating a photoresist on the source-drain metal layer, and exposing the photoresist to form a photoresist retained area and a photoresist non-retained area, wherein the photoresist retained area corresponds to areas of the source electrode and the drain electrode of the thin film transistor, and the photoresist non-retained area corresponds to other area than the areas of the source electrode and the drain electrode of the thin film transistor; etching the source-drain metal layer using a second etchant to remove the source-drain metal layer in the photoresist non-retained area, thus forming the source electrode and the drain electrode of the thin film transistor; etching the second metal oxide semiconductor layer between the source electrode and the drain electrode using the first etchant to remove the second metal oxide semiconductor layer between the source electrode and the drain electrode, thus forming the active layer of the thin film transistor, wherein the active layer includes the first metal oxide semiconductor layer, and the second metal oxide semiconductor layer between the first metal oxide semiconductor layer and the drain electrode and between the first metal oxide semiconductor layer and the source electrode.

Further, the second metal oxide semiconductor layer is made of ZnO, ZnON or IZO, the first metal oxide semiconductor layer is made of IGZO, and the first etchant is $H_2O_2$ etching solution. Optionally, the second metal oxide semiconductor layer is made of ZnO, ZnON, IZO or IGZO, the first metal oxide semiconductor layer is made of ITZO, IGZTO or IGZXO, and the first etchant is Al etching solution. Optionally, when the source-drain metal layer includes Cu, the second etchant is $H_2O_2$ etching solution; when the source-drain metal layer includes Mo or Al, AlNd, the second etchant is Mo etching solution. Herein, I represents indium, G represents gallium, Z or Zn represents zinc, T represents tin, O represents oxide, X refers to element Sn or a combination of element Sn (main element) and other trace elements.

With the above selections, the ratio of the rate of etching the second metal oxide semiconductor layer by the first etchant to the rate of etching the first metal oxide semiconductor layer by the first etchant is relatively large.

In a specific embodiment, in a case where the second metal oxide semiconductor layer is made of IZO, the first metal oxide semiconductor layer is made of IGZO, and the first etchant is $H_2O_2$ etching solution, a rate of etching IZO by the $H_2O_2$ etching solution can reach 13.6 Å/s, whereas a rate of etching IGZO by the $H_2O_2$ etching solution is merely 0.1 Å/s. It can be the seen that, the rate of etching IZO by $H_2O_2$ etching solution is much higher than the rate of etching IGZO by $H_2O_2$ etching solution. In another specific embodiment, in a case where the second metal oxide semiconductor layer is made of IGZO, the first metal oxide semiconductor layer is made of IGZXO, and the first etchant is Al etching solution, a rate of etching IGZO by the Al etching solution can reach 28 Å/s, whereas a rate of etching IGZXO by the Al etching solution is merely 0.1 Å/s. It can be the seen that, the rate of etching IGZO by Al etching solution is much higher than the rate of etching IGZXO by Al etching solution. In this way, when the second metal oxide semiconductor layer is etched using the first etchant, little damage is caused to the first metal oxide semiconductor layer.

Further, the method for fabricating a thin film transistor in the present embodiment can be used to fabricate a bottom gate type thin film transistor. Before the step of forming the metal oxide semiconductor pattern, the method further includes: providing a base substrate; forming a gate electrode of the thin film transistor on the base substrate; and forming a gate insulating layer on the base substrate having the gate electrode formed thereon, wherein the metal oxide semiconductor pattern is formed on the gate insulating layer.

Figure 5:
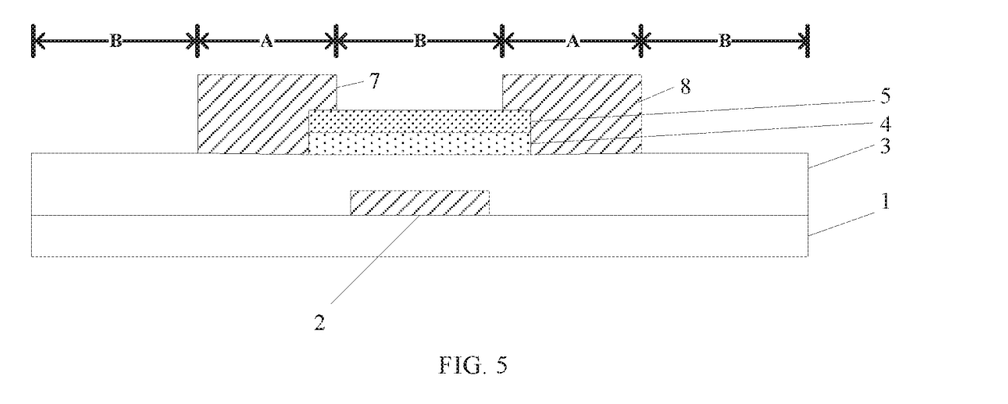
FIG. 5 is a schematic diagram of forming a source electrode and a drain electrode by etching a source-drain metal layer in an embodiment of the present disclosure.

As shown in FIG. 5, the bottom gate type thin film transistor specifically includes: a base substrate 1; a gate electrode 2; a gate insulating layer 3; an active layer on the gate insulating layer 3, including a first metal oxide semiconductor layer 4 and a second metal oxide semiconductor layer 5; a source electrode 7 and a drain electrode 8.

Further, the method for fabricating a thin film transistor in the present embodiment can be used to fabricate a top gate type thin film transistor. After the step of forming the source electrode, the drain electrode and the active layer of the thin film transistor, the method further includes: forming a gate insulating layer covering the source electrode, the drain electrode and the active layer; and forming a gate electrode of the thin film transistor on the gate insulating layer.

Figure 7:
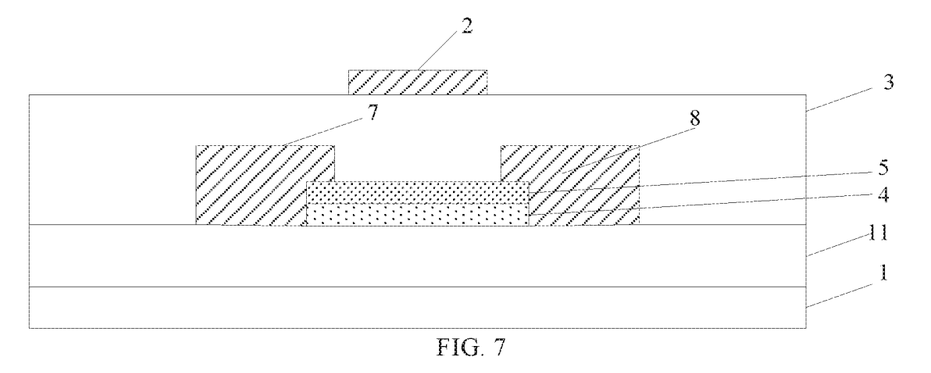
FIG. 7 is a schematic diagram of a thin film transistor in an embodiment of the present disclosure.

As shown in FIG. 7, the top gate type thin film transistor specifically includes: a base substrate 1; a buffer layer 11 on the base substrate 1; an active layer on the buffer layer 11, including a first metal oxide semiconductor layer 4 and a second metal oxide semiconductor layer 5; a source electrode 7 and a drain electrode 8; a gate insulating layer 3; and a gate electrode 2.

The method for fabricating a thin film transistor of the present disclosure will be further described below in conjunction with the accompanying drawings.

The method for fabricating a thin film transistor of the present embodiment includes the following steps.

Figure 1:
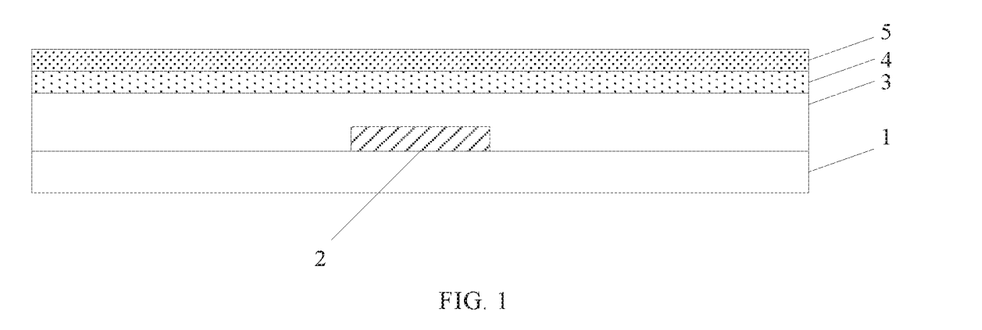
FIG. 1 is a schematic diagram of forming a first metal oxide layer and a second metal oxide layer on a base substrate in an embodiment of the present disclosure.

Step 1 includes: as shown in FIG. 1, forming a gate electrode 2, a gate insulating layer 3, a first metal oxide semiconductor layer 4 and a second metal oxide semiconductor layer 5 on a base substrate 1.

Here, the base substrate 1 may be a glass substrate or a quartz substrate. Specifically, a gate metal layer having a thickness of about 500 Å to about 4000 Å may be deposited on the base substrate 1 using sputtering or thermal evaporation method, and the gate metal layer may be made of a metal selected from Cu, Al, Ag, Mo, Cr, Nd, Ni, Mn, Ti, Ta, W, etc., or an alloy of metals selected therefrom, and may be of a single-layer structure or a multi-layer structure such as Cu/Mo, Ti/Cu/Ti, Mo/Al/Mo, etc. A layer of photoresist is coated on the gate metal layer, and is exposed using a mask to form a photoresist non-retained area and a photoresist retained area, wherein the photoresist retained area corresponds to an area of a pattern of the gate electrode, and the photoresist non-retained area corresponds to an area other than the area of the pattern of the gate electrode; a development process is performed such that the photoresist in the photoresist non-retained area is completely removed, and a thickness of the photoresist in the photoresist retained area remains unchanged; the gate metal film in the photoresist non-retained area is completely etched off by an etching process, and the remaining photoresist is stripped off, thereby forming the pattern of the gate electrode 2.

Afterwards, a gate insulating layer 3 having a thickness of 500 Å to 5000 Å may be deposited on the base substrate 1 having the gate electrode 2 formed thereon by using plasma enhanced chemical vapor deposition (PECVD) method. The gate insulating layer 3 may be made of an oxide, a nitride or an oxynitride, and corresponding reaction gases are $SiH_4$, $NH_3$, $N_2$ or $SiH_2Cl_2$, $NH_3$, $N_2$.

Subsequently, a first metal oxide semiconductor layer 4 and a second metal oxide semiconductor layer 5 are deposited on the gate insulating layer 3, and the first metal oxide semiconductor layer 4 and the second metal oxide semiconductor layer 5 meet the following requirement: a rate of etching the second metal oxide semiconductor layer 5 by a specific etchant is higher than a rate of etching the first metal oxide semiconductor layer 4 by the specific etchant. Optionally, the rate of etching the second metal oxide semiconductor layer 5 by the specific etchant is 10 times higher than the rate of etching the first metal oxide semiconductor layer 4 by the specific etchant. Metal oxide semiconductors that meet this requirement and corresponding etchants include the following cases: ① the second metal oxide semiconductor layer 5 is made of IZO, ZnO or ZnON, the first metal oxide semiconductor layer 4 is made of IGZO, and the corresponding etchant is hydrogen peroxide ($H_2O_2$) etching solution ($H_2O_2$ etching solution is an etchant used to etch Cu in current production line for mass production); ② the second metal oxide semiconductor layer 5 is made of IZO, IGZO, ZnO or ZnON, the first metal oxide semiconductor layer 4 is made of ITZO, IGZTO or IGZXO, and the corresponding etchant may be Al etching solution (an etchant used to etch Al in current production line for mass production) considering that acid etching solution can hardly etch the first metal oxide semiconductor layer 4.

Figure 2:
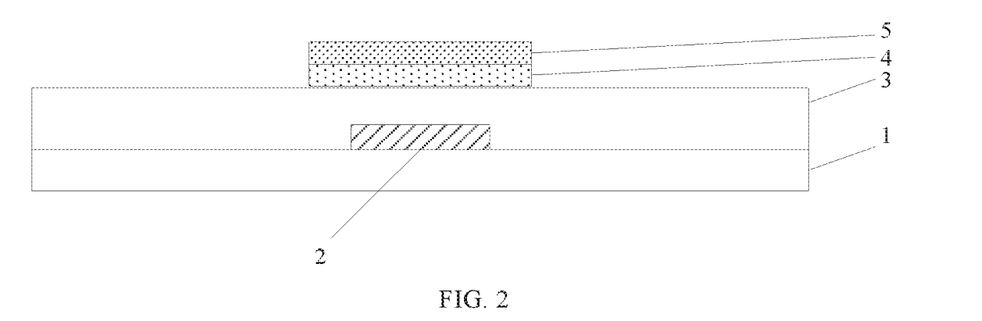
FIG. 2 is a schematic diagram of forming a metal oxide semiconductor pattern in an embodiment of the present disclosure.

Step 2 includes: as shown in FIG. 2, patterning the first metal oxide semiconductor layer 4 and the second metal oxide semiconductor layer 5 to form an active region pattern.

In this step, an etchant having a high etching rate for both the first metal oxide semiconductor layer 4 and the second metal oxide semiconductor layer 5, such as $H_2SO_4$ etching solution, $HNO_3$ etching solution, $H_2O_2$ etching solution, or ITO etching solution used in mass production, may be selected to etch the first metal oxide semiconductor layer 4 and the second metal oxide semiconductor layer 5.

Figure 3:
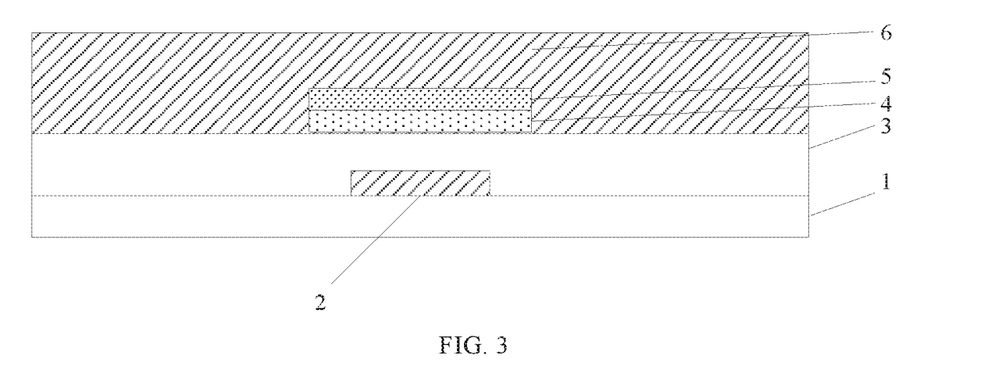
FIG. 3 is a schematic diagram of depositing a source-drain metal layer in an embodiment of the present disclosure.

Step 3 includes: as shown in FIG. 3, depositing a source-drain metal layer 6 on the base substrate 1 subjected to step 2.

Specifically, the source-drain metal layer 6 having a thickness of about 2000 Å to about 4000 Å may be deposited on the base substrate 1 subjected to step 2 by using magnetron sputtering, thermal evaporation or other film forming method, and the source-drain metal layer may be made of a metal selected from Cu, Al, Ag, Mo, Cr, Nd, Ni, Mn, Ti, Ta, W, etc., or an alloy of metals selected therefrom. The source-drain metal layer 6 may be of a single-layer structure or a multi-layer structure such as Cu/Mo, Ti/Cu/Ti, Mo/Al/Mo, etc.

Figure 4:
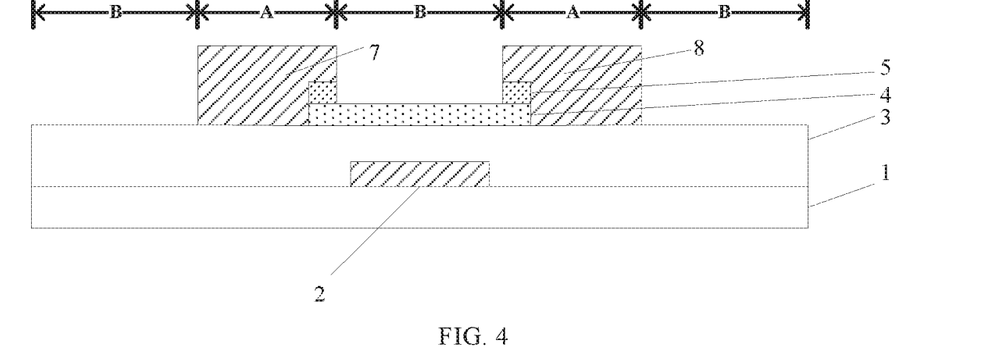
FIG. 4 is a schematic diagram of forming a source electrode, a drain electrode and an active layer in an embodiment of the present disclosure.

Step 4 includes: as shown FIG. 4, patterning the source-drain metal layer 6 and the active region pattern to form a source electrode 7, a drain electrode 8 and an active layer of the thin film transistor.

Specifically, a photoresist is coated on the source-drain metal layer 6, and is exposed and developed to form photoresist retained areas A and photoresist non-retained areas B, wherein the photoresist retained areas correspond to areas of the source electrode and the drain electrode of the thin film transistor, and the photoresist non-retained areas correspond to other areas than the areas of the source electrode and the drain electrode of the thin film transistor; the source-drain metal layer 6 and the second metal oxide semiconductor layer 5 are etched using a specific etchant to remove the source-drain metal layer 6 and the second metal oxide semiconductor layer 5 that are in the photoresist non-retained areas, thus forming the source electrode 7, the drain electrode 8 and the active layer of the thin film transistor, the active layer including the first metal oxide semiconductor layer, and the second metal oxide semiconductor layer between the first metal oxide semiconductor layer and the drain electrode and between the first metal oxide semiconductor layer and the source electrode.

Here, the rate of etching the second metal oxide semiconductor layer by the specific etchant is much higher than the rate of etching the first metal oxide semiconductor layer by the specific etchant, and the rate of etching the source-drain metal layer by the specific etchant is relatively high. In this way, while the source-drain metal layer is etched using the specific etchant, the second metal oxide semiconductor layer in the photoresist non-retained areas will also be etched off, whereas the first metal oxide semiconductor layer is retained because it is etched at a low rate. Consequently, residual ions of the source-drain metal layer can be avoided from remaining on the first metal oxide semiconductor layer (main structure of the active layer) to affect characteristics of the thin film transistor; in the meanwhile, because the rate of etching the second metal oxide semiconductor layer by the specific etchant is higher than the rate of etching the first metal oxide semiconductor layer by the specific etchant, when etching the second metal oxide semiconductor layer using the specific etchant, the second metal oxide semiconductor layer can be etched off easily, which can shorten etching time; the first metal oxide semiconductor layer can hardly be etched off, which can reduce damage to a back channel caused by the specific etchant and thus improve the stability of the thin film transistor.

Figure 6:
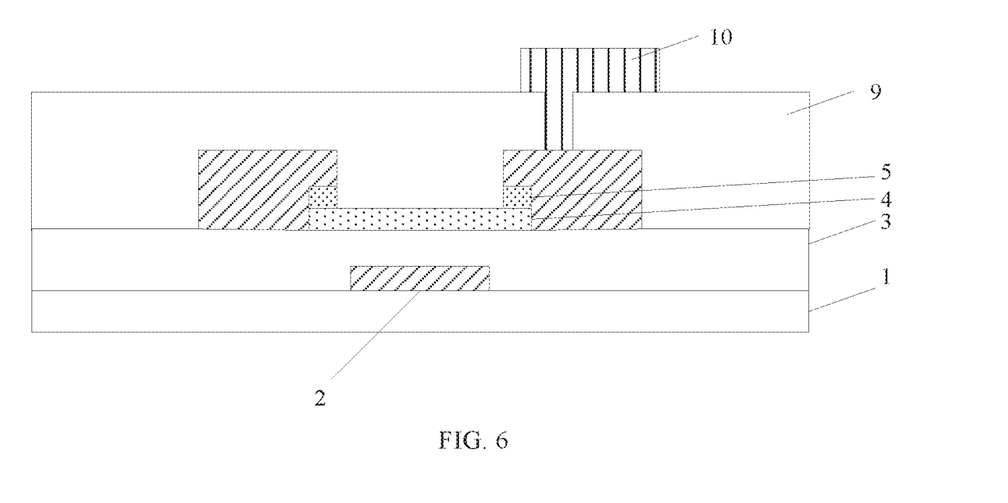
FIG. 6 is a schematic diagram of a display substrate in an embodiment of the present disclosure.

With the above steps, the thin film transistor of the present embodiment can be fabricated. Thereafter, as shown in FIG. 6, a passivation layer 9 and a pixel electrode 10 are formed on the base substrate 1 having the thin film transistor formed thereon, thus obtaining a display substrate.

The method for fabricating a thin film transistor of the present disclosure will be further described below in conjunction with the accompanying drawings.

The method for fabricating a thin film transistor of the present embodiment includes the following steps.

Step 1 includes: as shown in FIG. 1, forming a gate electrode 2, a gate insulating layer 3, a first metal oxide semiconductor layer 4 and a second metal oxide semiconductor layer 5 on a base substrate 1.

Here, the base substrate 1 may be a glass substrate or a quartz substrate. Specifically, a gate metal layer having a thickness of about 500 Å to about 4000 Å may be deposited on the base substrate 1 using sputtering or thermal evaporation method, and the gate metal layer may be made of a metal selected from Cu, Al, Ag, Mo, Cr, Nd, Ni, Mn, Ti, Ta, W, etc., or an alloy of metals selected therefrom, and may be of a single-layer structure or a multi-layer structure such as Cu/Mo, Ti/Cu/Ti, Mo/Al/Mo, etc. A layer of photoresist is coated on the gate metal layer, and is exposed using a mask to form a photoresist non-retained area and a photoresist retained area, wherein the photoresist retained area corresponds to an area of a pattern of the gate electrode, and the photoresist non-retained area corresponds to an area other than the area of the pattern of the gate electrode; a development process is performed such that the photoresist in the photoresist non-retained area is completely removed, and a thickness of the photoresist in the photoresist retained area remains unchanged; the gate metal film in the photoresist non-retained area is completely etched off by an etching process, and the remaining photoresist is stripped off, thereby forming the pattern of the gate electrode 2.

Afterwards, a gate insulating layer 3 having a thickness of 500 Å to 5000 Å may be deposited on the base substrate 1 having the gate electrode 2 formed thereon by using plasma enhanced chemical vapor deposition (PECVD) method. The gate insulating layer 3 may be made of an oxide, a nitride or an oxynitride, and corresponding reaction gases are $SiH_4$, $NH_3$, $N_2$ or $SiH_2Cl_2$, $NH_3$, $N_2$.

Subsequently, a first metal oxide semiconductor layer 4 and a second metal oxide semiconductor layer 5 are deposited on the gate insulating layer 3, and the first metal oxide semiconductor layer 4 and the second metal oxide semiconductor layer 5 meet the following requirement: an etching rate of a specific etchant on the second metal oxide semiconductor layer 5 is higher than an etching rate of the specific etchant on the first metal oxide semiconductor layer 4. Optionally, the etching rate of the specific etchant on the second metal oxide semiconductor layer 5 is 10 times higher than the etching rate of the specific etchant on the first metal oxide semiconductor layer 4. Metal oxide semiconductors that meet this requirement and corresponding etchants include the following cases: ① the second metal oxide semiconductor layer 5 is made of IZO, ZnO or ZnON, the first metal oxide semiconductor layer 4 is made of IGZO, and the corresponding etchant is hydrogen peroxide ($H_2O_2$) etching solution ($H_2O_2$ etching solution is an etchant used to etch Cu in current production line for mass production); ② the second metal oxide semiconductor layer 5 is made of IZO, IGZO, ZnO or ZnON, the first metal oxide semiconductor layer 4 is made of ITZO, IGZTO or IGZXO, and the corresponding etchant may be Al etching solution (an etchant used to etch Al in current production line for mass production) considering that acid etching solution can hardly etch the first metal oxide semiconductor layer 4.

Step 2 includes: as shown in FIG. 2, patterning the first metal oxide semiconductor layer 4 and the second metal oxide semiconductor layer 5 to form an active region pattern.

In this step, an etchant having a high etching rate on both the first metal oxide semiconductor layer 4 and the second metal oxide semiconductor layer 5, such as $H_2SO_4$ etching solution, $HNO_3$ etching solution, $H_2O_2$ etching solution, or ITO etching solution used in mass production, may be selected to etch the first metal oxide semiconductor layer 4 and the second metal oxide semiconductor layer 5.

Step 3 includes: as shown in FIG. 3, depositing a source-drain metal layer 6 on the base substrate 1 subjected to step 2.

Specifically, the source-drain metal layer 6 having a thickness of about 2000 Å to about 4000 Å may be deposited on the base substrate 1 subjected to step 2 by using magnetron sputtering, thermal evaporation or other film forming method, and the source-drain metal layer may be made of a metal selected from Cu, Al, Ag, Mo, Cr, Nd, Ni, Mn, Ti, Ta, W, etc., or an alloy of metals selected therefrom. The source-drain metal layer 6 may be of a single-layer structure or a multi-layer structure such as Cu/Mo, Ti/Cu/Ti, Mo/Al/Mo, etc.

Step 4 includes: as shown FIG. 5, patterning the source-drain metal layer 6 to form a source electrode 7 and a drain electrode 8 of the thin film transistor.

Specifically, a photoresist is coated on the source-drain metal layer, and is exposed to form photoresist retained areas A and photoresist non-retained areas B, wherein the photoresist retained areas correspond to areas of the source electrode and the drain electrode of the thin film transistor, and the photoresist non-retained areas correspond to other areas than the areas of the source electrode and the drain electrode of the thin film transistor; the source-drain metal layer is etched using another etchant to remove the source-drain metal layer in the photoresist non-retained areas, thus forming the source electrode 7 and the drain electrode 8 of the thin film transistor; the etchant used for etching the source-drain metal layer can etch off the source-drain metal layer, but has a low etching rate on the second metal oxide semiconductor layer or can hardly etch the second metal oxide semiconductor layer.

Step 5 includes: as shown in FIG. 4, etching the second metal oxide semiconductor layer 5 uncovered by the source electrode 7 and the drain electrode 8 of the thin film transistor to form an active layer of the thin film transistor.

The specific etchant used in this step has a much higher etching rate on the second metal oxide semiconductor layer than on the first metal oxide semiconductor layer. In this way, while the second metal oxide semiconductor layer is etched using this specific etchant, the first metal oxide semiconductor layer is retained because it is etched at a low rate. Consequently, residual ions of the source-drain metal layer can be avoided from remaining on the first metal oxide semiconductor layer (main structure of the active layer) to affect characteristics of the thin film transistor; in the meanwhile, because the rate of etching the second metal oxide semiconductor layer by the specific etchant is higher than the rate of etching the first metal oxide semiconductor layer by the specific etchant, when etching the second metal oxide semiconductor layer using the specific etchant, the second metal oxide semiconductor layer can be etched off easily, which can shorten etching time; the first metal oxide semiconductor layer can hardly be etched off, which can reduce damage to a back channel caused by the specific etchant and thus improve the stability of the thin film transistor.

With the above steps, the thin film transistor of the present embodiment can be fabricated. Thereafter, as shown in FIG. 6, a passivation layer 9 and a pixel electrode 10 are formed on the base substrate 1 having the thin film transistor formed thereon, thus obtaining a display substrate.

Embodiments of the present disclosure further provide a thin film transistor fabricated by using the above-described method. An active layer of the thin film transistor includes a first metal oxide semiconductor layer, and a second metal oxide semiconductor layer between the first metal oxide semiconductor layer and a drain electrode and between the first metal oxide semiconductor layer and a source electrode, wherein a rate at which the second metal oxide semiconductor layer is etched by a preset etchant is higher than a rate at which the first metal oxide semiconductor layer is etched by the preset etchant.

In the present embodiment, the metal oxide semiconductor pattern includes the first metal oxide semiconductor layer and the second metal oxide semiconductor layer which are stacked, the second metal oxide semiconductor layer being above the first metal oxide semiconductor layer, and the second metal oxide semiconductor layer between the source electrode and the drain electrode may be completely etched off when or after forming the source electrode and the drain electrode of the thin film transistor. In this way, residual conductive ions can be avoided from remaining on the first metal oxide semiconductor layer (main structure of the active layer) to affect characteristics of the thin film transistor. In the meanwhile, because the rate of etching the second metal oxide semiconductor layer by the first etchant is higher than the rate of etching the first metal oxide semiconductor layer by the first etchant, when etching the second metal oxide semiconductor layer using the first etchant, the second metal oxide semiconductor layer is more easily to be etched off, which can shorten etching time; the first metal oxide semiconductor layer is less easily to be etched off, which can reduce damage to a back channel caused by the first etchant and thus improve the stability of the thin film transistor.

Embodiments of the present disclosure further provide a display substrate including the above-described thin film transistor. The display substrate may further include other components such a power source, a drive chip, a light emitting component, and the like.

Embodiments of the present disclosure further provide a display apparatus including the above-described display substrate. The display apparatus may be any product or component with a display function, such as a liquid crystal television, a liquid crystal display, a digital photo frame, a mobile phone, a tablet computer or the like. The display apparatus further includes a flexible circuit board, a printed circuit board and a backplane.

The forgoing is optional implementations of the present disclosure, and it should be pointed out that, for a person of ordinary skill in the art, various improvements and modifications may be made without departing from the principle of the present disclosure, and these improvements and modifications shall also be regarded as falling into the protection scope of the present disclosure.

The invention claimed is:

1. A method for fabricating a thin film transistor, comprising:
    forming a metal oxide semiconductor pattern comprising a first metal oxide semiconductor layer and a second metal oxide semiconductor layer, which are stacked, the second metal oxide semiconductor layer being above the first metal oxide semiconductor layer;
    depositing a source-drain metal layer on the metal oxide semiconductor pattern;
    etching the source-drain metal layer and the second metal oxide semiconductor layer to form a source electrode, a drain electrode and an active layer of the thin film transistor,
    wherein the active layer is obtained after removing the second metal oxide semiconductor layer between the source electrode and the drain electrode using a first etchant, and a ratio of a rate of etching the second metal oxide semiconductor layer by the first etchant to a rate of etching the first metal oxide semiconductor layer by the first etchant is no smaller than 10 such that the first etchant causes substantially no damage to the first metal oxide semiconductor layer.

2. The method of claim 1, wherein the steps of depositing the source-drain metal layer on the metal oxide semiconductor pattern and etching the source-drain metal layer and the second metal oxide semiconductor layer to form the source electrode, the drain electrode and the active layer of the thin film transistor comprise:
    depositing the source-drain metal layer above the metal oxide semiconductor pattern; coating a photoresist on the source-drain metal layer, and exposing and developing the photoresist to form a photoresist retained area and a photoresist non-retained area, wherein the photoresist retained area corresponds to areas of the source electrode and the drain electrode of the thin film transistor, and the photoresist non-retained area corresponds to other area than the areas of the source electrode and the drain electrode of the thin film transistor; and
    etching the source-drain metal layer and the second metal oxide semiconductor layer using the first etchant to remove the source-drain metal layer and the second metal oxide semiconductor layer in the photoresist non-retained area, thus forming the source electrode, the drain electrode and the active layer of the thin film transistor, wherein the active layer comprises the first metal oxide semiconductor layer, and the second metal oxide semiconductor layer between the first metal oxide semiconductor layer and the drain electrode and between the first metal oxide semiconductor layer and the source electrode.

3. The method of claim 2, wherein the second metal oxide semiconductor layer is made of ZnO, ZnON or IZO, the first metal oxide semiconductor layer is made of IGZO, and the first etchant is $H_2O_2$ etching solution.

4. The method of claim 2, wherein
the second metal oxide semiconductor layer is made of ZnO, ZnON, IZO or IGZO, the first metal oxide semiconductor layer is made of ITZO, IGZTO or IGZXO, where X is element Sn, and the first etchant is Al etching solution.

5. The method of claim 1, wherein the steps of depositing the source-drain metal layer on the metal oxide semiconductor pattern and etching the source-drain metal layer and the second metal oxide semiconductor layer to form the source electrode, the drain electrode and the active layer of the thin film transistor comprise:
depositing the source-drain metal layer above the metal oxide semiconductor pattern;
coating a photoresist on the source-drain metal layer, and exposing the photoresist to form a photoresist retained area and a photoresist non-retained area, wherein the photoresist retained area corresponds to areas of the source electrode and the drain electrode of the thin film transistor, and the photoresist non-retained area corresponds to other area than the areas of the source electrode and the drain electrode of the thin film transistor;
etching the source-drain metal layer using a second etchant to remove the source-drain metal layer in the photoresist non-retained area, thus forming the source electrode and the drain electrode of the thin film transistor; and
etching the second metal oxide semiconductor layer between the source electrode and the drain electrode using the first etchant to remove the second metal oxide semiconductor layer between the source electrode and the drain electrode, thus forming the active layer of the thin film transistor, wherein the active layer comprises the first metal oxide semiconductor layer, and the second metal oxide semiconductor layer between the first metal oxide semiconductor layer and the drain electrode and between the first metal oxide semiconductor layer and the source electrode.

6. The method of claim 5, wherein the second metal oxide semiconductor layer is made of ZnO, ZnON or IZO, the first metal oxide semiconductor layer is made of IGZO, and the first etchant is $H_2O_2$ etching solution.

7. The method of claim 5, wherein the second metal oxide semiconductor layer is made of ZnO, ZnON, IZO or IGZO, the first metal oxide semiconductor layer is made of ITZO, IGZTO or IGZXO, where X is element Sn, and the first etchant is Al etching solution.

8. The method of claim 5, wherein
the source-drain metal layer comprises Cu, and the second etchant is $H_2O_2$ etching solution.

9. The method of claim 5, wherein the source-drain metal layer comprises Mo or Al, AlNd, and the second etchant is Mo etching solution.

10. The method of claim 1, wherein before the step of forming the metal oxide semiconductor pattern, the method further comprises:
providing a base substrate;
forming a gate electrode of the thin film transistor on the base substrate; and
forming a gate insulating layer on the base substrate having the gate electrode formed thereon, wherein the metal oxide semiconductor pattern is formed on the gate insulating layer.

11. The method of claim 1, wherein after the step of forming the source electrode, the drain electrode and the active layer of the thin film transistor, the method further comprises:
forming a gate insulating layer covering the source electrode, the drain electrode and the active layer; and
forming a gate electrode of the thin film transistor on the gate insulating layer.

* * * * *